(12) United States Patent
Hussein et al.

(10) Patent No.: US 6,406,995 B1
(45) Date of Patent: Jun. 18, 2002

(54) PATTERN-SENSITIVE DEPOSITION FOR DAMASCENE PROCESSING

(75) Inventors: Makarem A. Hussein, Beaverton; Alan M. Myers, Portland; Charles H. Recchia, Portland; Sam Sivakumar, Portland; Angelo W. Kandas, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/345,586

(22) Filed: Jun. 30, 1999

Related U.S. Application Data

(63) Continuation-in-part of application No. 09/164,508, filed on Sep. 30, 1998.

(51) Int. Cl.[7] .................. H01L 21/4763; H01L 21/311; G03C 5/00
(52) U.S. Cl. .................. 438/638; 438/622; 438/637; 438/687; 438/700; 438/703; 430/313
(58) Field of Search .................. 438/637, 638, 438/687, 622, 624, 636, 640, 669, 672, 675, 688, 695, 700, 701, 703, 948, 952; 430/311, 312, 313, 314, 316, 317

(56) References Cited

U.S. PATENT DOCUMENTS

| | | | |
|---|---|---|---|
| 5,422,309 A | | 6/1995 | Zettler et al. .............. 437/192 |
| 5,702,982 A | * | 12/1997 | Lee et al. .................. 437/195 |
| 5,705,430 A | | 1/1998 | Avanzino et al. ........... 437/195 |
| 5,817,572 A | * | 10/1998 | Chiang et al. ............... 438/624 |
| 5,939,241 A | * | 8/1999 | Leu et al. .................. 430/318 |
| 5,989,997 A | * | 11/1999 | Lin et al. .................... 438/622 |
| 6,057,239 A | * | 5/2000 | Wang et al. ................ 438/689 |
| 6,143,647 A | * | 11/2000 | Pan et al. ................... 438/637 |

FOREIGN PATENT DOCUMENTS

| | | |
|---|---|---|
| JP | 10-223755 | 8/1998 |
| WO | WO99/56310 | 4/1999 |
| WO | WO 00/05763 | 3/2000 |

OTHER PUBLICATIONS

Andrew et al, MCM–LD: Large area processing using photosensitive–BCB, IEEE transactions on components, packaging, and manufacturing technology—part B vol. 18 No. 2, pp 269–276, May 1995.*

* cited by examiner

*Primary Examiner*—Olik Chaudhuri
*Assistant Examiner*—Thanhha Pham
(74) *Attorney, Agent, or Firm*—Blakely, Sokoloff, Taylor & Zafman LLP

(57) ABSTRACT

A method of forming an interconnection including the steps of forming a sacrificial material that comprises a physical property that is generally insensitive to a photo-reaction in a via through a dielectric material to a masking material over a conductive material. The method also includes forming a trench over in the dielectric material over the via and removing the sacrificial material from the via.

30 Claims, 5 Drawing Sheets

PATTERN-SENSITIVE DEPOSITION FOR DAMASCENE PROCESSING

CROSS-REFERENCE TO RELATED APPLICATION

This application is a continuation-in-part of co-pending application Ser. No. 09/164,508, filed Sep. 30, 1998 by applicants, Peter K. Moon, Makarem A. Hussein, Alan Myers, Charles Recchia, Sam Sivakumar, and Angelo Kandas, entitled "A Pattern-Sensitive Deposition for Damascene Processing."

BACKGROUND OF THE INVENTION

1. Field of the Invention

The invention relates to integrated circuit processing and, more particularly, to the patterning of interconnections on an integrated circuit.

2. Background of the Invention

Modern integrated circuits use conductive interconnections to connect the individual devices on a chip or to send or receive signals external to the chip. Popular types of interconnection include aluminum alloy interconnections and copper interconnections.

One significant difference between aluminum and copper interconnections is the rate of oxidation of the metals. Pure aluminum is oxidized to aluminum oxide in the presence of oxygen. However, aluminum has a fairly low diffusion coefficient for oxygen in aluminum oxide, such that as soon as the aluminum oxide is formed, the pure metal (Al) underneath the aluminum oxide layer does not react with oxygen. The reaction between aluminum and oxygen is described as a self-limiting oxidation reaction.

Copper oxidation, on the other hand, is not self limiting. In the presence of oxygen, pure copper will continue to oxidize until substantially all the copper is oxidized to a copper oxide. Thus, once a copper interconnection is formed and patterned, an additional step of adding a passivation layer, typically silicon nitride ($Si_3N_4$), is employed to protect the exposed interconnection material from air or moisture.

One process used to form interconnections, particularly copper interconnections is a damascene process. In a damascene process, a trench is cut in a dielectric and filled with copper to form the interconnection. A via may be in the dielectric beneath the trench with a conductive material in the via to couple the interconnection to underlying integrated circuit devices or underlying interconnections.

A photoresist is typically used over the dielectric to pattern a via or a trench or both in the dielectric for the interconnection. After patterning, the photoresist is removed. The photoresist is typically removed by an oxygen plasma (oxygen ashing). The oxygen used in the oxygen ashing step can react with an underlying copper interconnection and oxidize the interconnection. Accordingly, damascene processes typically employ a thin hard mask or barrier layer of $Si_3N_4$ directly over the copper interconnection to protect the copper from oxidation during oxygen ashing in the formation of a subsequent level interconnection. In general, the $Si_3N_4$ hard mask layer is very thin, for example, roughly 10% of the thickness of the dielectric layer. Thus, when, for example, the via is cut through the oxide by way of an etch, prior art processes require that the etch stops at the underlying $Si_3N_4$. When the trench is then formed in the dielectric above the via, prior art processes require that the etch not remove the $Si_3N_4$ exposed by the via. The ability to etch the via and trench and preserve $Si_3N_4$ requires great selectivity of the etchant such that the thin $Si_3N_4$ layer is not etched away.

What is needed is a process, particularly useful with damascene processes, that does not require unrealistic expectations of etch selectivity.

SUMMARY OF THE INVENTION

A method of forming an interconnection is disclosed. In one aspect of the method, a sacrificial material that comprises a property that is generally insensitive to a photo-reaction is formed in a via through a dielectric material to a masking material over a conductive material. A trench is formed in the dielectric material over the via and the sacrificial material is removed from the via.

DETAILED DESCRIPTION OF THE INVENTION

The invention relates in one aspect to a method of forming an interconnection. The invention is useful in one embodiment in protecting underlying interconnections during the formation of subsequent or higher level interconnections. The invention also alleviates the burden of unrealistic etch characteristics between a dielectric material and an underlying hard mask incorporated to protect an underlying interconnection such as copper interconnection that might be used as part of a damascene process. The invention alleviates this concern by incorporating a second masking material or a sacrificial material in the via over a hard mask. In this manner, photoresist material used to pattern, for example, a via or trench in a dielectric, may be removed without concern of oxidizing an underlying copper interconnection.

FIGS. 1–11 illustrate a dual damascene process for forming an interconnection over an underlying copper interconnection. A typical integrated circuit may have, for example, four or five interconnection layers or lines each insulated form one and another by dielectric material.

FIGS. 1–11 illustrate, for example, the formation of a second interconnection layer or line over and to be electrically connected to a first interconnection layer or line. It is to be appreciated that the method of the invention may be used for each interconnection layer or line.

Figure 1:
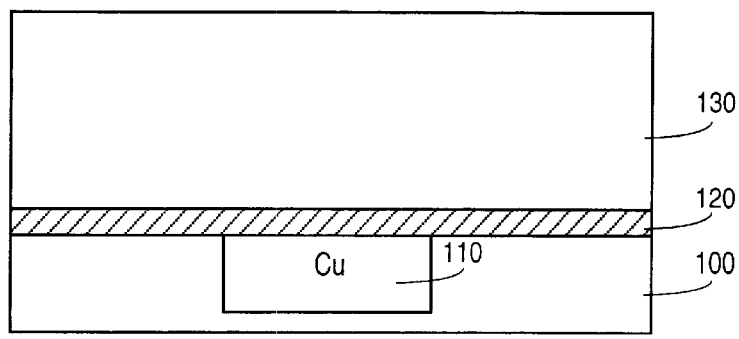
FIG. 1 illustrates a cross-sectional side view of a portion of an integrated circuit substrate showing an interconnection insulated by a dielectric material, a hard mask directly overlying the interconnection and a dielectric material overlying the hard mask in accordance with an embodiment of the invention.

FIG. 1 illustrates a cross-sectional side view of a portion of an integrated circuit substrate or wafer having a first copper interconnection line 110 formed in dielectric material 100. Copper interconnection line 110 is, for example, coupled to an underlying device or devices formed in and on a semiconductor substrate. The dielectric material is, for example, $SiO_2$ formed by a tetraethyl orthosilicate (TEOS) or plasma enhanced chemical vapor deposition (PECVD) source. In this example, dielectric layer 100 and copper interconnection 110 are planarized.

Overlying the planarized dielectric layer 100/copper interconnection line 110 is first mask layer 120. First mask layer 120 serves, in one aspect, as a mask or barrier to prevent oxidation of copper interconnection line 110. In one embodiment, first mask layer 120 is a layer of silicon nitride ($Si_3N_4$) or silicon oxynitride ($Si_xN_yO_z$). It is to be appreciated that other dielectric materials, including organic polymers, may be suitable for first mask layer 120.

In the example where first mask layer 120 is $Si_3N_4$ or $Si_xN_yO_z$, the material is deposited, for example, by chemical vapor deposition (CVD) to a suitable thickness of approximately 100 nm to mask copper interconnection line 110 during subsequent etching steps. $Si_3N_4$ and $Si_xN_yO_z$ generally have chemical properties, including dielectric constants, that tend to increase the capacitance between interconnection lines and integrated circuits. Accordingly, a thin amount, e.g., less than or equal to 100 nm, is generally deposited to protect copper interconnection line 110 but not to unacceptably increase the capacitance between interconnection lines. For the remainder of this description, an example of first mask layer 120 of $Si_3N_4$ material will be described.

Overlying first mask layer 120 is dielectric layer 130. Dielectric layer 130 is, for example, a TEOS or PECVD formed $SiO_2$ deposited to a thickness of approximately 1,000 nm. The thickness of dielectric layer 130 will depend, in part, on size characteristics and scaling considerations for the device. Once dielectric layer 130 is deposited and formed, the material is planarized for example with a chemical-mechanical polish.

Figure 2:
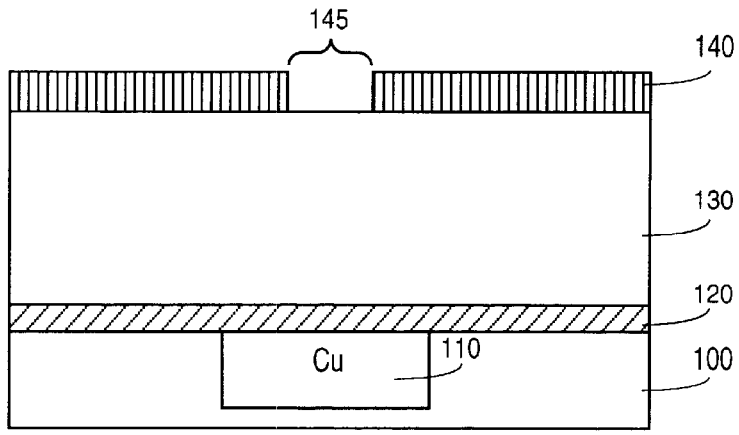
FIG. 2 shows the substrate of FIG. 1 after the further processing step of patterning a photoresist mask over the dielectric material in accordance with an embodiment of the invention.

Next, as shown in FIG. 2, via pattern or second mask layer 140 is patterned over dielectric layer 130. Second mask layer 140 is, for example, a photo-imageable material such as a photoresist. A positive photoresist, for example, is spun onto the surface of dielectric layer 130 generally across the wafer. A mask or reticle is then used to expose a portion of the photoresist to a light source. In this case, the reticle or mask defines an area for via or opening 145 over dielectric layer 130. Once the photoresist material of second mask layer 140 is exposed to light, the exposed material is removed in a conventional manner such as for example, by a developer, and the substrate is baked to harden the remaining photoresist. The process leaves second mask layer 140 of photoresist having an opening 145 over dielectric layer 130.

Figure 3:
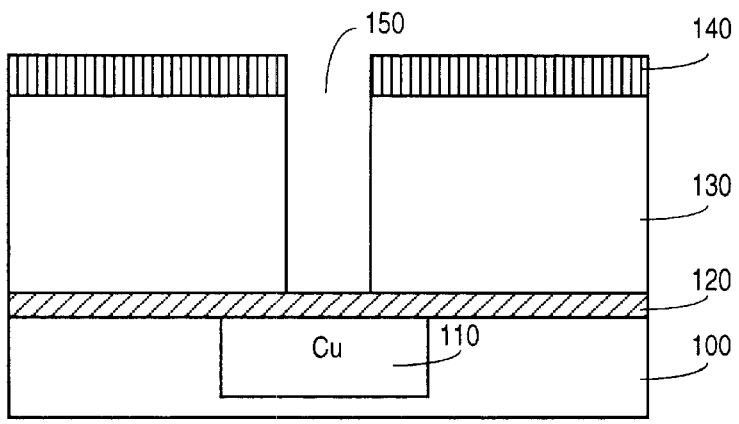
FIG. 3 shows the substrate of FIG. 1 after the further processing step of opening a via through the dielectric material and stopping at the hard mask layer in accordance with an embodiment of the invention.
Figure 4:
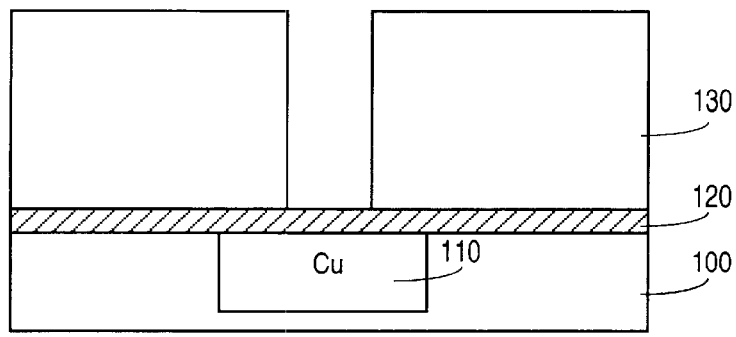
FIG. 4 shows the substrate of FIG. 1 after the further processing step of cleaning the substrate to remove the photoresist mask in accordance with an embodiment of the invention.

As shown in FIG. 3, once second mask layer 140 is patterned, an etchant is used to open via 150 through dielectric layer 130. An etchant is chosen that does not substantially react or disrupt underlying first mask layer 120. In the case of a $SiO_2$ dielectric layer 130, for example, overlying a $Si_3N_4$ first mask layer 120, a suitable etchant to selectively etch $SiO_2$ without substantially etching $Si_3N_4$ is, for example, a $C_4F_8$ etch chemistry. One objective of the via etch is to etch the via through dielectric layer 130 and stop the etching prior to etching through $Si_3N_4$ first mask layer 120. It is to be appreciated that some of the $Si_3N_4$ material of first mask layer 120 may be etched away during the via etch, however, the etch should be monitored so that enough $Si_3N_4$ material remains overlying and protecting copper interconnection line 110.

Once via 150 is opened through dielectric layer 130, via pattern or second mask layer 140 is removed from the surface of dielectric layer 130. In the example where via pattern or second mask layer 140 is a photoresist, the material may be removed through a conventional oxygen plasma (e.g., oxygen ashing). At this point, a wet clean step as known in the art may also be used to remove any residual particles.

Figure 5:
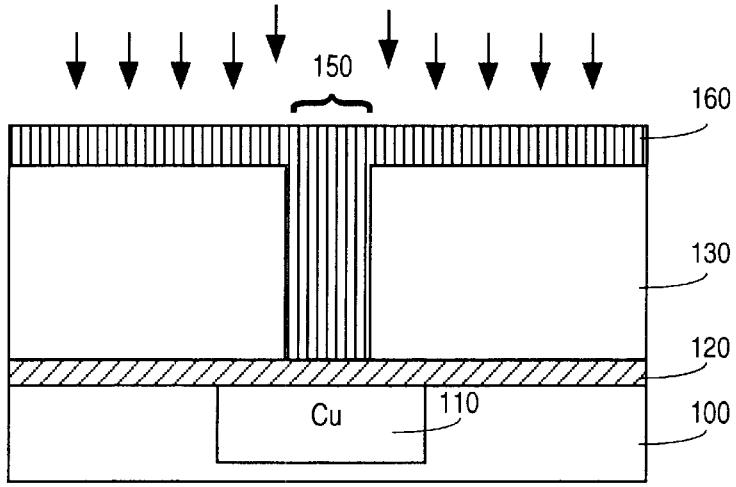
FIG. 5 shows the substrate of FIG. 1 after depositing a sacrificial material in the via in accordance with an embodiment of the invention and the step of rendering the sacrificial material insensitive to a photo-reaction.

Next, as shown in FIG. 5, sacrificial material 160 is introduced over dielectric layer 130 and in via 150. In one embodiment, sacrificial material 160 is a material that is capable of uniformly filling small vias (e.g., via having diameter less than 0.25 microns). In this embodiment, sacrificial material 160 is also either generally insensitive to or capable of being made generally insensitive to a development step such as a photoreaction. In other words, once introduced in via 150, a significant portion of sacrificial material 160 should not change its chemical properties. One example is a material that is insoluble in photoresist developer upon exposure to light, particularly light having a wavelength in the ultraviolet (UV) range.

One suitable material for sacrificial material 160 is heat-treated positive photoresist. FIG. 5 shows an example where photoresist, such as conventional positive photoresist, is spun-coated on the surface of dielectric layer 130 and fills via 150. Positive photoresist is generally sensitive to light exposure, as described above with reference to FIG. 2. After coating of the photoresist material, the substrate is heated to cure the photoresist material. The heat treatment is, for example, on the order of 150–200° C. In addition to curing the photoresist, the heat treatment performs a second function in this embodiment, in that it generally renders the photoresist material insensitive to a photoreaction in the presence of light exposure, e.g., UV light exposure.

As an alternative to heat-treated photoresist, other suitable materials for sacrificial material 160 include dyed photoresist or photoresist material with no photo-active compound, i.e., photoresist resin. One suitable dyed photoresist is a dye material with light-absorbing properties. Upon exposure to light, including UV light, the dye in the dyed photoresist material will absorb a majority of the light in a region near the superior or top portion of sacrificial material 160 in via 150 (relative to dielectric layer 100/copper interconnection line 110) to inhibit a photo-reactive change of the physical property of the majority of the dyed photoresist and thereby rendering a plug of photoresist material in via 150 after the exposure step. One type of dyed photoresist is commercially available from Tokyo Ohka Kogyo of Japan. The material may be spun on the surface of dielectric layer 130 and cured by a conventional heat treatment. A similar process may be utilized for photoresist resin (i.e., without a photo-active compound), such as DP-Resin, commercially available from Tokyo Ohka Kogyo. Absent a photo-active compound, subsequent exposure to light, including UV light, will not change the physical properties of the compound as an etch-resistant plug material of via 150.

Figure 6:
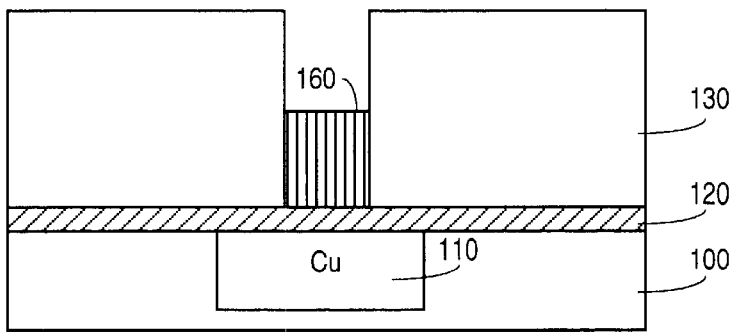
FIG. 6 shows the substrate of FIG. 1 after the cleaning the surface of the substrate and retaining sacrificial material in the via in accordance with an embodiment of the invention.

FIG. 6 shows the substrate after the processing step of controlled removal of sacrificial material 160 from the surface of dielectric layer 130. In the embodiment, where sacrificial material 160 is a photoresist, the controlled removal of photoresist material from the surface of dielectric layer 130 may be accomplished using an oxygen plasma (e.g., oxygen ashing) as known in the art. Alternatively, the photoresist material may be exposed to a plasma or gas of hydrogen, oxygen/nitrogen, and hydrogen/nitrogen. The end point of the removal step is the surface of dielectric layer 130. This may followed by an optional wet clean step as known in the art to remove any residual particles.

In one embodiment, sacrificial material 160 serves the objective of protecting first mask layer 120 during a subsequent etch to, for example, form a trench pattern for a subsequent interconnection line. Accordingly, sacrificial material 160 does not need to completely fill via 150. Still further, sacrificial material 160 should not impede a subsequent etch, such as a subsequent trench etch of dielectric layer 130 around via 150. Thus, in certain situations, it may be desirable to remove a portion of sacrificial material 160 that is in via 150.

In the example where sacrificial material 160 is photoresist, a portion of the photoresist material in via 150 may be removed by continuing the etch with the oxygen plasma (i.e., over-ashing) after the endpoint of the surface of dielectric layer 130 is reached. FIG. 6 shows an embodied step of the method of the invention wherein a portion of sacrificial material 160 is removed from via 150. It is also to be appreciated that, in another embodiment, sacrificial material 160 is not patterned to completely fill via 150. In such an embodiment, a portion of sacrificial material 160 would not need to be removed, for example, in an over-ashing step.

Figure 12:
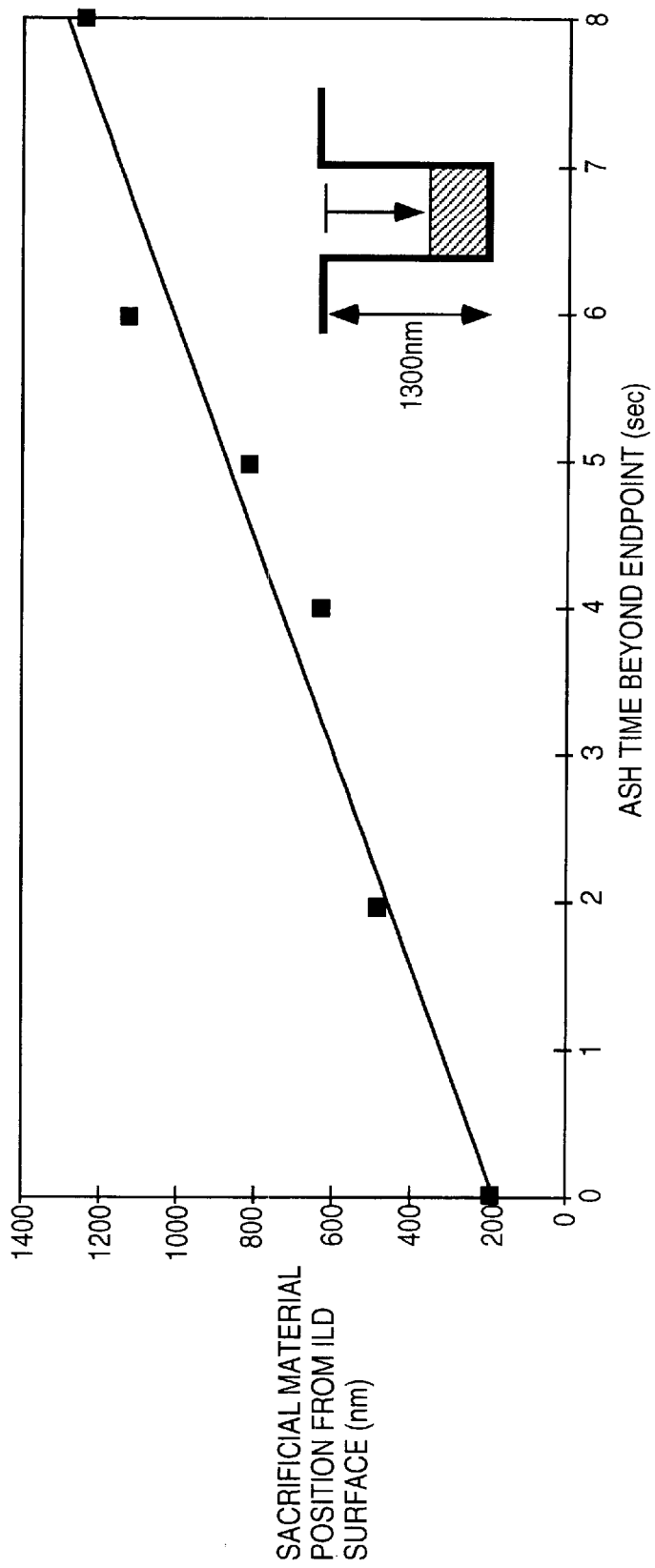
FIG. 12 is a graphical representation of the controlled height from a surface of dielectric material on a substrate into a via.

FIG. 12 is a graphical representation of the controlled height from the surface of dielectric layer 130 into a via having a depth of 1300 nanometers. The height of sacrificial material 160 relative to the surface of dielectric layer 130 is compared to the ashing time in seconds beyond the endpoint (i.e., beyond the surface of dielectric layer 130). In this embodiment, a photoresist is utilized as photoresist material 160 and the substrate is exposed to an oxygen/nitrogen plasma mixed under low temperature condition (about 200° C.) in photoresist removing equipment. The low temperature during ash process helps control the photoresist removal process. Thus, according to one embodiment of the invention, sacrificial material 160 may be formed with a controlled height in via 150 (e.g., a predetermined height over first mask layer 120) based on over-ashing. In this manner, the within-wafer and wafer-to-wafer variability of the height of sacrificial material 160 in a via may be significantly reduced, compared to the performance obtained by using a longer develop process, for example.

Figure 7:
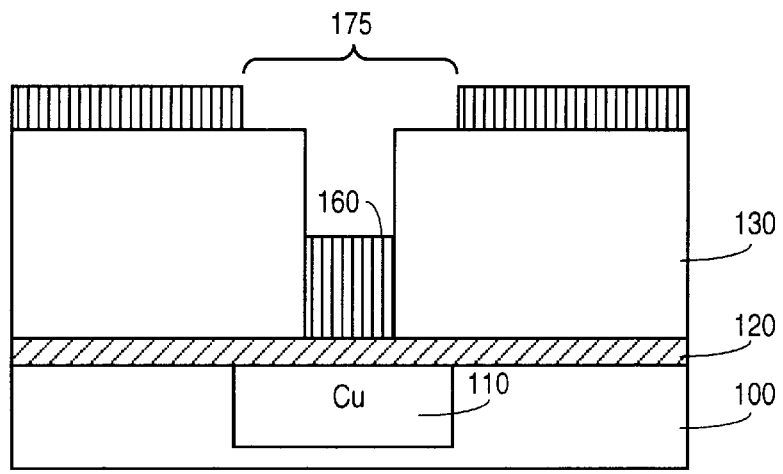
FIG. 7 shows the substrate of FIG. 1 after the further processing step of patterning a masking material over the dielectric material in accordance with an embodiment of the invention.
Figure 8:
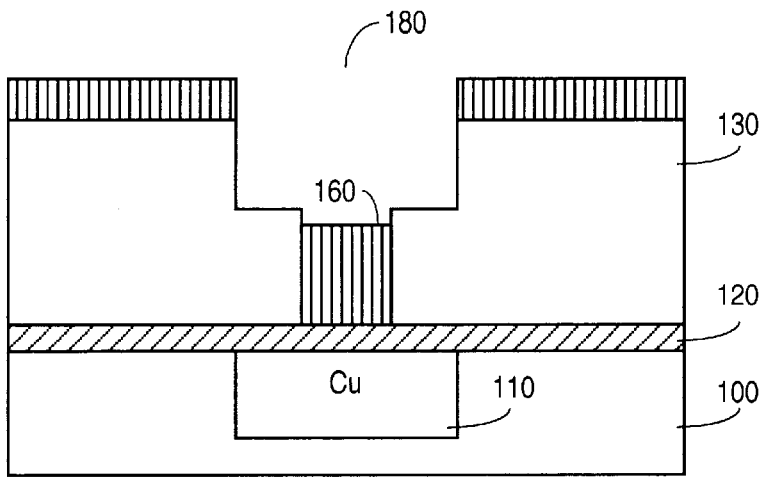
FIG. 8 shows the substrate of FIG. 1 after the further processing step of opening a trench in the dielectric material in accordance with an embodiment of the invention.

Once sacrificial material 160 is formed as desired in via 150, pattern mask or third mask layer 170 is patterned over dielectric layer 130 to pattern a trench in oxide 130. FIG. 7 shows pattern mask or third mask layer 170 patterned over dielectric layer 130 in such a way as to leave an area 175 exposed for trench patterning. A suitable pattern or third mask layer 170 is, for example, a photoresist formed as described above with respect to second mask layer 140.

In the embodiment where third mask layer 170 is a positive photoresist, the photoresist is coated over dielectric layer 130. A mask or reticle is then used to expose a portion of the photoresist to a light source. The exposed portion defines a trench over via 150. The exposed portion includes an area over sacrificial material 160. Because sacrificial material 160 is generally insensitive to a photoreaction, sacrificial material 160 is not affected by the exposure to, for example, an UV light source. Sacrificial material 160 is insensitive either in that it does not contain any photo-active components or has been treated, for example, by heat, to inactivate its sensitivity to a photoreaction. Alternatively, a photoresist containing a light-absorbing dye (e.g., a dyed photoresist) may be used as sacrificial material 160. In this embodiment, upon light exposure to define an etch pattern for a subsequent trench in dielectric layer 130, the light-absorbing dye absorbs any UV light striking sacrificial material 160. Thus, a trench patterning step to pattern a photoresist mask over dielectric layer 130 will not significantly effect sacrificial material 160.

Once third mask layer 170 is formed, trench 180 is formed in dielectric layer 130. Trench 180 is patterned to a depth suitable for a conductive interconnection. In one embodiment, for example, trench 180 has a depth of approximately 500 nm. Again, the precise dimensions of trench 180 will vary depending on the scale of the integrated circuit to be formed. In the case of dielectric layer 130 of $SiO_2$, a suitable etchant to form trench 180 is, for example $C_4F_8/O_2/Ar$ etch chemistry.

By incorporating sacrificial material 160 in via 150, underlying first mask layer 120 is protected during the trench etch described above. If concerns of removing underlying first mask layer 120 (such as, for example, $Si_3N_4$ layer) are removed, a suitable etchant may be chosen for the trench etch without concern for selectivity between dielectric layer 130 and first mask layer 120. Accordingly, a suitable etchant can be chosen based on other parameters, for example, the etch rate, the verticalness of the etch, etc.

Figure 9:
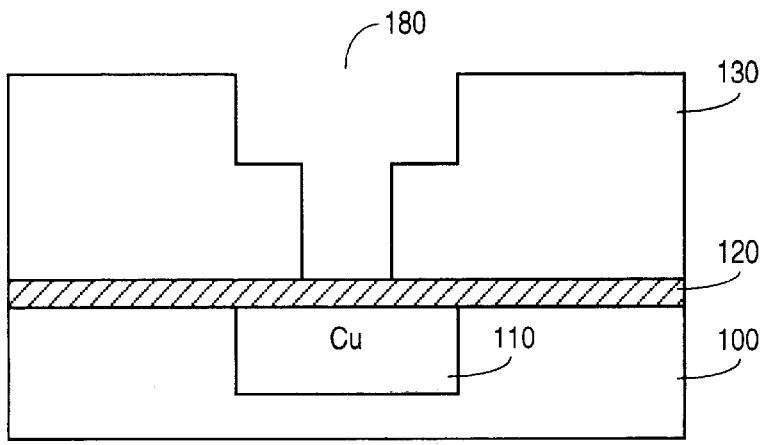
FIG. 9 shows the substrate of FIG. 1 after the further processing step of removing the material patterned for the trench and the sacrificial material in accordance with an embodiment of the invention.

FIG. 9 shows the substrate after the subsequent processing step of removing third mask layer 170. FIG. 9 also shows the substrate after the step of removing sacrificial material 160 and exposing underlying first mask layer 120.

By incorporating sacrificial material 160 in via 150, the concerns of the prior art of removing underlying first mask layer 120 during trench etch are alleviated. Accordingly, sacrificial material 160 is selected, in one embodiment, to have a low etch rate during trench etch. In one embodiment, sacrificial material 160 and third mask layer 170 are each photoresist thus allowing the simultaneous removal of sacrificial material 160 and third mask layer 170. In this manner, when third mask layer 170 is also photoresist, both third mask layer 170 and sacrificial material 160 may be removed by, for example, an oxygen ashing. Since first mask layer 120 overlies copper interconnection line in via 150, copper interconnection line 110 is protected from oxidation by the presence of oxygen during the oxygen ashing step.

Figure 10:
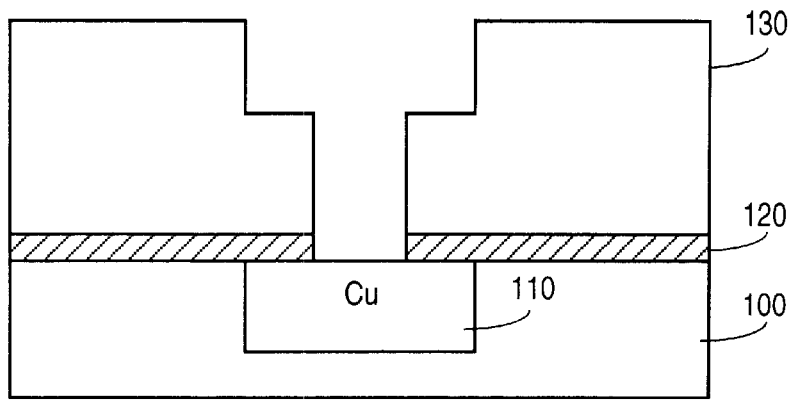
FIG. 10 shows the substrate of FIG. 1 after the further processing step of extending the via through the hard mask material to expose the copper interconnection in accordance with an embodiment of the invention.

Once sacrificial material 160 is removed from via 150, a subsequent etch may be used to remove the exposed $Si_3N_4$ material of first mask layer 120. Removing exposed first mask layer 120 in via 150 exposes underlying copper interconnection 110 as shown in FIG. 10. A suitable etchant to remove first mask layer 120 of $Si_3N_4$ is, for example, a $CF_4/O_2$ etch chemistry.

Figure 11:
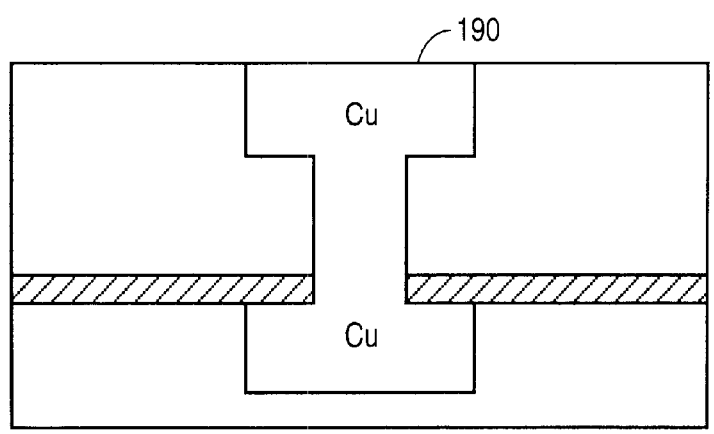
FIG. 11 shows the substrate of FIG. 1 after the further processing step of depositing a copper material in the trench and via openings and planarizing the copper with the dielectric material in accordance with an embodiment of the invention.

After exposing underlying copper interconnection 110, FIG. 11 shows the substrate after the subsequent processing step of depositing copper material 190 in trench 180 and via 150. The deposition precedes via a conventional damascene process. Once copper material 190 is deposited in via 150 and trench 180, the substrate may be planarized according to conventional damascene processing techniques to form a subsequent level interconnection. The process steps described above with respect to FIGS. 1–11 may then be repeated for a subsequent interconnection layer.

In the preceding detailed description, the invention is described with reference to specific embodiments thereof. It will however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   introducing a photosensitive sacrificial material in a via through a dielectric material to a masking material over a conductive material;
   rendering a portion of the photosensitive sacrificial material insensitive to a photo-reaction;
   forming a trench in the dielectric material over the via; and
   after forming the trench, removing the photosensitive sacrificial material from the via.

2. The method of claim 1, wherein
   after introducing the photosensitive sacrificial material in the via, rendering a portion of the photosensitive sacrificial material insensitive to a photo-reaction.

3. The method of claim 2, wherein the photosensitive sacrificial material comprises photoresist, and the rendering of the photosensitive sacrificial material insensitive to a photo-reaction comprises exposing the photoresist to heat.

4. The method of claim 2, wherein the photosensitive sacrificial material is a photoresist and the formation of the photosensitive sacrificial material comprises:
   coating the photoresist over a surface of the dielectric material and in the via;
   exposing the substrate to a sufficient temperature to render a portion of the photoresist insensitive to a photo-reaction; and
   removing the photoresist from the surface of the dielectric material.

5. The method of claim 4, wherein the removal of the photoresist material from the surface of the dielectric comprises:
   exposing the photoresist material to a plasma or gas of one of oxygen, hydrogen, oxygen/nitrogen, and hydrogen/nitrogen.

6. The method of claim 1, wherein the photosensitive sacrificial material is photoresist comprising a light absorbing material, and the method further comprises:
   prior to the formation of the trench, depositing a photosensitive masking material over the surface of the dielectric material; and
   subjecting the photosensitive masking material to a light source to expose an area in the masking material for the trench.

7. The method of claim 1, wherein the formation of the photosensitive sacrificial material comprises:
   coating the photosensitive sacrificial material over a surface of the dielectric material; and
   removing a portion of the photosensitive sacrificial material from the via to establish a height of the photosensitive sacrificial material in the via over the masking material.

8. The method of claim 7, wherein the removal of a portion of the photosensitive sacrificial material comprises:
   etching beyond a time sufficient to remove the photosensitive sacrificial material from the surface of the dielectric material.

9. In an integrated circuit device including a first interconnection, a method of forming a second interconnection comprising:
   forming a sacrificial material in a via through a dielectric material to a masking material over the first interconnection;
   rendering a portion of the sacrificial material insensitive to a photo-reaction;
   forming a trench in the dielectric material over the via;
   after forming the trench, removing the sacrificial material from the via;
   extending the via through the masking material; and
   depositing a conductive material in the via.

10. The method of claim 9, wherein rendering a portion of the sacrificial material insensitive to a photo-reaction occurs after forming the sacrificial material in the via.

11. The method of claim 10, wherein the sacrificial material comprises photoresist, and rendering a portion of the sacrificial material insensitive to a photo-reaction comprises exposing the photoresist to heat.

12. The method of claim 9, wherein the sacrificial material is a photoresist and the method comprises:
   coating the substrate over a surface of the dielectric material;
   exposing the phototesist to a sufficient temperature to render a portion of the photoresist insensitive to a photo-reaction;
   removing the photoresist from the surface of the dielectric material and in the via to establish a height of the sacrificial material in the via over the masking material.

13. The method of claim 12, wherein the removal of the photoresist material from the surface of the dielectric comprises:
   exposing the photoresist material to a plasma.

14. The method of claim 9, wherein the sacrificial material is photoresist comprising a light absorbing material, and the method further comprises:
   prior to the formation of the trench, depositing a photosensitive masking material over the surface of the dielectric material; and
   subjecting the photosensitive masking material to a light source to expose an area in the masking material for the trench.

15. The method of claim 9, wherein the formation of the sacrificial material comprises:
   coating the sacrificial material over a surface of the dielectric material; and
   removing a portion of the sacrificial material from the via to establish a height of the sacrificial material in the via over the masking material.

16. The method of claim 15, wherein the removal of a portion of the sacrificial material comprises:

etching beyond a time sufficient to remove the sacrificial material from the surface of the dielectric material.

17. A damascene method comprising:
   forming a via through a dielectric material to expose a masking material over an interconnection of a substrate;
   forming a sacrificial material in the via;
   rendering the sacrificial material insensitive to a photo reaction;
   forming a trench in the dielectric material over a portion of the via;
   after forming the trench, removing the sacrificial material from the via;
   extending the via through the first masking material; and
   depositing a conductive material in the via and the trench.

18. The method of claim 17, wherein the formation of a sacrificial material comprises:
   depositing a sacrificial material comprising a photosensitive material; and
   rendering a portion of the sacrificial material insensitive to a photo-reaction.

19. The method of claim 18, wherein the sacrificial material comprises photoresist and the rendering a portion of the sacrificial material insensitive to a photo-reaction comprises exposing the photoresist to a sufficient temperature to render a portion of the photoresist insensitive to a photo-reaction.

20. The method of claim 18, wherein the sacrificial material is a photoresist comprising a light absorbing material and the rendering step a portion of the sacrificial material insensitive to a photo-reaction comprises:
   subjecting the photoresist to a light source such that the photoresist absorbs sufficient light to render a portion of the photoresist insensitive to a subsequent photo-reaction.

21. The method of claim 17, wherein the sacrificial material fills less than the entire portion of the trench.

22. The method of claim 17, wherein the sacrificial material is a non-photosensitive photoresist.

23. A method comprising:
   coating a layer of photoresist material over a substrate surface and in a patterned via;
   rendering the coated photoresist material insensitive to a photo-reaction by baking;
   ashing the photoresist material so as to remove the photoresist material from the substrate surface but not from inside the via;
   patterning a trench over the via; and
   after forming the trench, removing the photoresist material from the via.

24. The method of claim 23, further comprising, after ashing the photoresist material to remove the photoresist material from the substrate surface, ashing to recess the photoresist material into the via.

25. The method of claim 23, wherein the ashing comprises introducing an oxygen/nitrogen plasma mixture at a substrate temperature on the order of about 200° C.

26. A method comprising:
   introducing a photo-insensitive material over a substrate surface and in a patterned via;
   ashing the photo-insensitive material so as to remove the photo-insensitive material from substrate surface but not from inside the via;
   patterning a trench over the via; and
   after forming the trench, removing the photo-insensitive material from the via.

27. The method of claim 26, further comprising, after ashing the photo-insensitive material to remove the photo-insensitive material from the substrate surface, ashing to recess the photo-insensitive material into the via.

28. The method of claim 26, wherein the ashing comprises introducing an oxygen/nitrogen plasma mixture at a substrate temperature on the order of about 200° C.

29. A method comprising:
   coating a photoresist material comprising an ultraviolet light absorption dye over a substrate surface and in a patterned via; and
   removing the sacrificial material so as to remove the photoresist material from the substrate surface but not from inside the via;
   patterning the trench over the via; and
   after forming the trench, removing the photoresist material from the via.

30. The method of claim 29, wherein forming the trench comprises:
   patterning a photo-sensitive material over the substrate surface; and
   etching the trench.

* * * * *

UNITED STATES PATENT AND TRADEMARK OFFICE
CERTIFICATE OF CORRECTION

PATENT NO. : 6,406,995 B1
DATED : June 18, 2002
INVENTOR(S) : Hussein et al.

It is certified that error appears in the above-identified patent and that said Letters Patent is hereby corrected as shown below:

<u>Column 8,</u>
Line 37, delete "substrate" and insert -- photoresist --.
Line 39, delete "phototesist" and insert -- photoresist --.

Signed and Sealed this

Fifth Day of November, 2002

Attest:

Attesting Officer

JAMES E. ROGAN
Director of the United States Patent and Trademark Office